Figure 1:
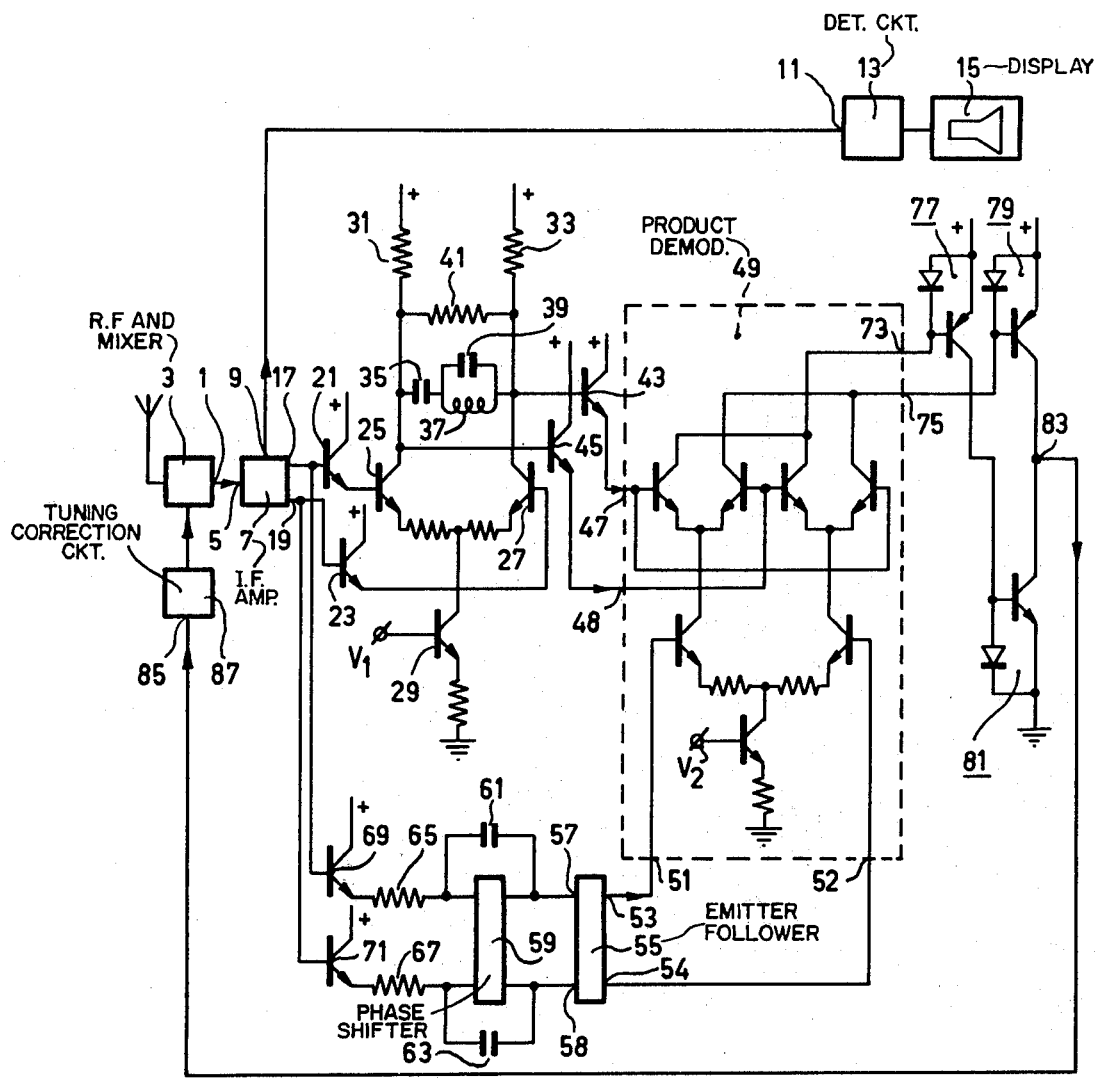

United States Patent [19]
Beriere

[11] 3,968,325
[45] July 6, 1976

[54] TELEVISION RECEIVER WITH NOISE IMMUNE AFC CIRCUIT

[75] Inventor: Louis Joseph Gerardus Beriere, Eindhoven, Netherlands

[73] Assignee: U.S. Philips Corporation, New York, N.Y.

[22] Filed: July 24, 1974

[21] Appl. No.: 491,557

[30] Foreign Application Priority Data
Aug. 3, 1973 Netherlands .................. 7310739

[52] U.S. Cl. .......................................... 178/5.8 AF
[51] Int. Cl.² ...................................... H04N 5/50
[58] Field of Search..... 178/5.8 R, 5.8 AF, DIG. 12; 325/423, 418

[56] References Cited
UNITED STATES PATENTS
3,435,345  3/1969  Ashby .............................. 325/423
3,459,887  8/1969  Baker .............................. 178/5.8 RX
3,469,025  9/1969  Evans .............................. 178/5.8 R
3,673,321  6/1972  Janssen ........................... 178/5.8 AF X
3,704,420  11/1972  Villard, Jr. ..................... 325/418 X Primary Examiner—Robert L. Griffin
Assistant Examiner—Mitchell Saffian
Attorney, Agent, or Firm—Frank R. Trifari; Henry I. Steckler

[57] ABSTRACT

Correction of the influence of noise on the output voltage of a detection circuit for automatic frequency control by using a product demodulator with a filter having a pole at the picture intermediate frequency and a zero crossing at a frequency between a sound intermediate frequency and the picture intermediate frequency.

2 Claims, 2 Drawing Figures

TELEVISION RECEIVER WITH NOISE IMMUNE AFC CIRCUIT

The invention relates to a television receiver including an automatic tuning correction circuit comprising a detection circuit tuned to the desired picture intermediate frequency for generating a tuning correction signal to be applied to a frequency correction circuit, said detection circuit in co-operation with the response curve of the section of the receiver arranged before the detection circuit exhibiting substantially no error signal due to noise signals.

A television receiver of the kind described above is known from U.S. Pat. No. 3,469,025 in which the detection circuit is a discriminator circuit having two diodes one diode of which has such a bias that in addition to a first zero crossing at the desired picture IF frequency a second zero crossing of the discriminator curve is obtained at a frequency located between the sound IF frequency and the picture IF frequency, and the tuning correction signal substantially exhibits no error due to noise signals in the total passed frequency band.

An object of the invention is to provide a different solution for the prevention of the occurrence of an error voltage or current caused by noise.

To this end a telvision receiver of the kind described in the preamble according to the invention is characterized in that the detection circuit includes a product demodulator arranged as a phase detector having a first input to which an IF signal is applied at least through a filter which has a pole at the desired picture IF frequency and a zero at a frequency located between the desired sound IF frequency and the desired picture IF frequency, and a second input to which the IF signal is also applied.

In a detection circuit in a receiver according to the invention the influence of noise is then compensated for by the frequency characteristic of the phase-determining element of the detection circuit. The detection circuit furthermore includes a product demodulator circuit which can be very suitably formed as an integrated circuit.

The invention will now be described with reference to the drawing.

In the drawing

Figure 2:
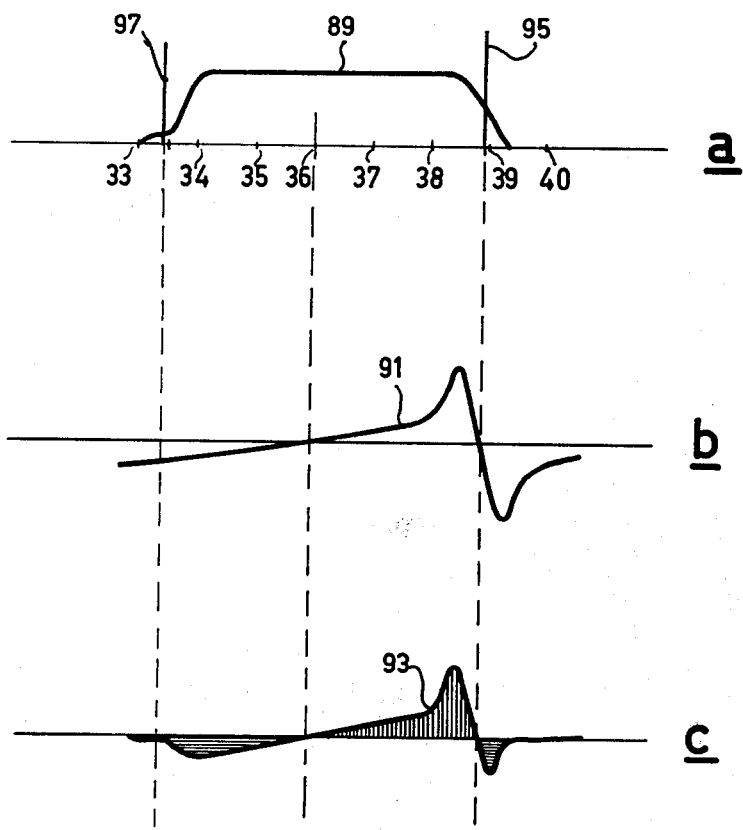

FIG. 1 shows by way of a circuit diagram a television receiver according to the invention and FIG. 2 shows by way of a number of graphs the behaviour of a tuning correction circuit in a television receiver according to the invention.

In FIG. 1 an output 1 of an RF and mixing section 3 is connected to an input 5 of an IF amplifier 7.

An output 9 of the IF amplifier 7 provides an IF signal for an input 11 of a detection circuit 13 which supplies a display section 15 with the required signals.

IF signals in phase opposition are developed at two output terminals 17, 19 of the IF amplifier which signals are applied through two emitter followers 21, 23 to the bases of two transistors 25, 27. The transistors 25, 27 are emitter-coupled and their emitters are fed by a transistor 29 arranged as a DC source.

The collectors of the transistors 25, 27 are each connected through resistors 31, 33 to a positive supply voltage. A filter constituted by a series-parallel resonant circuit having a series arrangement of a capacitor 35 and a parallel circuit with an inductor 37 and a capacitor 39 is incorporated between these collectors. This series arrangement is shunted by a resistor 41.

The collectors of the transistors 25, 27 are furthermore connected through emitter followers 43, 45 to first inputs 47, 48 of a product demodulator 49. Second inputs 51, 52 of the product demodulator 49 are connected to outputs 53, 54 of an emitter follower circuit 55, inputs 57, 58 of which are connected to an output of a 90° phase shifter constituted by a difference amplifier 59 whose outputs are connected through capacitors 61, 63 to the corresponding inputs and two resistors 65, 67. The resistors 65, 67 are fed by an IF signal from two emitter followers connected to the outputs 17, 19 of the IF amplifier 7.

The product demodulator 49, the signal path with the 90° phase-shifting network 61, 65; 63, 67 and the signal path with the filter 35, 37, 39, 41 constitute a detection circuit with a phase detector.

Outputs 73, 75 are connected through three current mirror circuits 77, 79, 81 to an output 83 of the detection circuit. The output 83 supplies a current to an input 85 of a tuning correction circuit which is present in an oscillator 87, for example, in the form of a variable capacity diode connected to a resistive network. The oscillator 87 is coupled to the mixer stage 3.

The operation of the circuit arrangement will now be described with reference to FIG. 2.

The receiver has a response curve 89 up to the outputs 17, 19 of the IF amplifier 7.

The detection circuit has a response curve as denoted by 91 between its inputs 17, 19 and its output 83. At the picture IF frequency of 38.9 MHz a first zero crossing occurs due to a pole of the filter 35, 37, 39, 41 at a parallel resonant frequency, and the normal operating range of the automatic tuning correction circuit is present around this zero crossing. Due to a zero of the filter 35, 37, 39, 41 caused by a series resonance a second zero crossing occurs at approximately 36 MHz and the output current at lower frequencies becomes negative.

The total characteristic of the receiver and the detection circuit up to the output 83 is denoted by the curve 93 in which the positive part is vertically shaded and the negative part is horizontally shaded.

Noise signals received by the receiver and located in the frequency range between 36 MHz and 38.9 MHz give a positive contribution to the current supplied by the output 83 and noise signals located in the frequency range between 33 and 36 MHz and 38.9 and 39.5 MHz give a negative contribution to this current. By correct choice of the quality factor of the filter 35, 37, 39, 41 and the tuning of the second zero crossing an elimination of the contribution of noise signals to the current to the output 83 can be achieved in a simple manner so that no tuning error can be caused.

FIG. 2 shows the desired location of the IF picture carrier denoted by 95 and of the sound carrier denoted by 97. In case of a possible increase of the frequencies of these carriers the sound carrier will produce a negative current at the output 83 which supports the negative output current produced by the picture carrier and extends the control range of the circuit arrangement, because in case of a large frequency deviation the sound carrier contributes to the control when the picture carrier no longer does. Although due to the Nyquist edge of the curve 89 the control range at the picture IF frequency seems to be limited, this is extended again by the said operation of the filter 35, 37, 39, 41.

A favourable composition of the filter for a television receiver with a picture IF frequency of 38.9 MHz and a sound IF frequency of 33.4 MHz is found to be a capacitor 35 of 6.8 pF, an inductor 37 of approximately 17 μH, a capacitor 39 of 33 pF and a resistor 41 of 4 kΩ when the collector resistors 31, 33 each have a value of 3.3 kΩ. For a quality factor between a value of 30 and 50 a favourable location of the second zero crossing occurs at a frequency which is located substantially at two thirds the distance of the said sound IF frequency from the desired picture IF frequency relative to the latter.

It will be evident that the desired detection curve may alternatively be obtained with filters composed in a different manner provided they have a pole and a zero crossing at the locations shown.

What is claimed is:

1. An automatic tuning correction circuit for a television signal having desired video and audio frequencies, said circuit comprising a frequency correction circuit; phase detector means for generating a tuning correction signal having a first input for receiving said television signal, a second input, and an output coupled to said correction circuit; and means for eliminating erroneous tuning correction signals due to noise comprising a filter having an input means for receiving said television signal and an output coupled to said generating means second input, said filter having a response pole at the desired video frequency and a response zero at a frequency intermediate said desired video and audio frequencies.

2. A circuit as claimed in claim 1, wherein said filter comprises a series parallel circuit with a quality factor of between 30 and 50, a parallel resonance at the desired video frequency and a series resonance at a frequency which is substantially located at two thirds the distance between the desired audio frequency and the desired video frequency relative to said desired video frequency.

* * * * *